United States Patent
Sambucetti et al.

(10) Patent No.: US 6,646,345 B2
(45) Date of Patent: Nov. 11, 2003

(54) METHOD FOR FORMING CO-W-P-AU FILMS

(75) Inventors: Carlos Juan Sambucetti, Croton on Hudson, NY (US); Judith Marie Rubino, Ossining, NY (US); Daniel Charles Edelstein, New Rochelle, NY (US); Cyryl Cabral, Jr., Ossining, NY (US); George Frederick Walker, New York, NY (US); John G Gaudiello, Poughkeepsie, NY (US); Horatio Seymour Wildman, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/966,629

(22) Filed: Sep. 27, 2001

(65) Prior Publication Data

US 2002/0123220 A1 Sep. 5, 2002

Related U.S. Application Data

(62) Division of application No. 09/320,499, filed on May 26, 1999, now Pat. No. 6,323,128.

(51) Int. Cl.$^7$ ................................................ H01L 23/48
(52) U.S. Cl. ....................................... 257/748; 257/764
(58) Field of Search ................................. 257/748, 750, 257/751–3, 758, 762–4, 767–70

(56) References Cited

U.S. PATENT DOCUMENTS

| | | |
|---|---|---|
| 4,148,750 A | 4/1979 | Pine |
| 4,654,224 A | 3/1987 | Allred et al. |
| 4,798,808 A | 1/1989 | Berman |
| 4,944,985 A | 7/1990 | Alexander et al. |
| 4,963,974 A | 10/1990 | Ushio et al. |
| 5,063,169 A | 11/1991 | De Bruin et al. |
| 5,080,763 A | 1/1992 | Baigetsu |
| 5,302,464 A | 4/1994 | Nomura et al. |
| 5,318,621 A | 6/1994 | Krulik et al. |
| 5,373,629 A | 12/1994 | Hupe et al. |
| 5,523,174 A | 6/1996 | Tamaki |
| 5,583,073 A | 12/1996 | Lin et al. |
| 5,695,810 A | 12/1997 | Dubin et al. |
| 5,849,170 A | 12/1998 | Djokic et al. |
| 6,015,747 A | 1/2000 | Lopatin et al. |
| 6,054,173 A | 4/2000 | Robinson et al. |
| 6,180,505 B1 * | 1/2001 | Uzoh .......................... 257/737 |
| 6,417,094 B1 * | 7/2002 | Zhao et al. .................. 438/627 |

* cited by examiner

*Primary Examiner*—Wael Fahmy
*Assistant Examiner*—Ginette Peralta
(74) *Attorney, Agent, or Firm*—Robert M. Trepp; Randy W. Tung

(57) ABSTRACT

A method for forming a quaternary alloy film of Co—W—P—Au for use as a diffusion barrier layer on a copper interconnect in a semiconductor structure and devices formed incorporating such film are disclosed. In the method, a substrate that has copper conductive regions on top is first pre-treated by two separate pre-treatment steps. In the first step, the substrate is immersed in a $H_2SO_4$ rinsing solution and next in a solution containing palladium ions for a length of time sufficient for the ions to deposit on the surface of the copper conductive regions. The substrate is then immersed in a solution that contains at least 15 gr/l sodium citrate or EDTA for removing excess palladium ions from the surface of the copper conductive regions. After the pre-treated substrate is rinsed in a first rinsing step by distilled water, the substrate is electroless plated a Co—W—P film on the surfaces of the copper conductive regions in a first plating solution that contains cobalt ions, tungstate ions, citrate ions and a reducing agent. After the substrate coated with the Co—W—P film is rinsed in a second rinsing step by distilled water, the substrate is immersed in a second electroless plating solution for depositing a Au layer on top of the Co—W—P film. The present invention novel quaternary alloy film can be used as an effective diffusion barrier layer between a copper interconnect and silicon substrate or $SiO_2$ dielectric layers.

5 Claims, 3 Drawing Sheets

METHOD FOR FORMING CO-W-P-AU FILMS

This is a divisional of copending application(s) Ser. No. 09/320,499 now U.S. Pat. No. 6,323,128 filed on May 26, 1999

FIELD OF THE INVENTION

The present invention generally relates to a method for forming quaternary composite films of Co—W—P—Au and devices formed containing such films and more particularly, relates to a method for forming quaternary films of Co—W—P—Au by first forming a Co—W—P alloy film and then electrolessly depositing a Au film on top of the alloy film such that Au diffuses into the alloy film forming the quaternary composite film and devices formed containing such film.

BACKGROUND OF THE INVENTION

The technology of making interconnections for providing vias, lines and other recesses in semiconductor chip structures, flat panel displays, and package applications has been developed for many years. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing, possible Si diffusion into Al during annealing which leads to contact and junction failure, and poor electromigration resistance. The electro migration phenomenon occurs when the superposition of an electronic field onto random thermal diffusion in a metallic solid causes a net drift of ions. Consequently, a number of aluminum alloys have been developed which provided advantages over pure aluminum. For instance, U.S. Pat. No. 4,566,177 discloses a conductive layer of an alloy of aluminum containing up to 3% by weight of silicon, copper, nickel, chromium and manganese to improve electromigration resistance. U.S. Pat. No. 3,631,304 discloses aluminum alloys with aluminum oxide which were also used to improve electromigration resistance.

More recently VLSI and ULSI technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter using copper based on its desirable high conductivity.

In the formation of VLSI and ULSI interconnection structures such as vias and lines, copper is deposited into a line, via or other recesses to interconnect semiconductor regions or devices located on the same substrate. Copper is known to have problems at semiconductor device junctions due to its fast reaction rate with Si. Any diffusion of copper ions into the silicon substrate can cause device failure. In addition, pure copper does not adhere well to oxygen containing dielectrics such as silicon dioxide and polyimide.

It is therefore an object of the present invention to provide a diffusion barrier layer between a copper interconnect and other semiconductor materials that does not have the drawbacks or shortcomings of the conventional diffusion barriers.

It is another object of the present invention to provide a diffusion barrier layer between a copper interconnect and a silicon substrate in a semiconductor structure.

It is a further object of the present invention to provide a diffusion barrier between a copper interconnect and a dielectric material layer in which the interconnect is formed.

It is another further object of the present invention to provide a diffusion barrier layer for a copper interconnect in a semiconductor structure wherein the barrier layer is a quaternary composite film of Co—W—P—Au.

It is still another object of the present invention to provide a diffusion barrier layer for a copper interconnect in a semiconductor structure wherein the barrier layer consists of a Au film coated on a Co—W—P alloy film.

It is yet another object of the present invention to provide a diffusion barrier layer for a copper interconnect in a semiconductor structure which is formed by two sequential electroless plating processes.

It is still another further object of the present invention to provide a method for forming a quaternary Co—W—P—Au composite film by first electroless plating a Co—W—P film on the surface of a copper conductive region in a plating bath containing cobalt ions, tungstate ions, citrate ions and a reducing agent, and then immersing the substrate in a Au electroless plating solution for depositing a Au layer on top.

It is yet another further object of the present invention to provide an electronic structure which includes a Co—W—P—Au composite film coating in a via opening that is filled with copper for forming a copper interconnect.

SUMMARY OF THE INVENTION

In accordance with the present invention, a method for forming a diffusion barrier layer for a copper interconnect in a semiconductor structure and the structure formed are disclosed.

In a preferred embodiment, a method for forming a Co—W—P—Au composite film on a substrate can be carried out by the operating steps of cleaning a substrate which has a copper conductive region in 0.2 M $H_2SO_4$ for 10~20 sec., then rinse in $H_2O$ for 60 sec., the substrate is then immersed in a solution that contains palladium ions for a length of time sufficient for palladium metal to deposit by a redox reaction on surfaces of the copper conductive regions, rinsing the substrate in $H_2O$, immersing the substrate in a solution containing at least 15 gr/l sodium citrate or EDTA (Ethylene diaminetetra acetic acid) complexing agents for removing excess palladium ions from the surfaces of the copper conductive regions, rinsing the substrate with distilled water, electroless plating a Co—W—P film on the surfaces of copper conductive regions in a plating solution containing cobalt ions, tungstate ions, citrate ions and a reducing agent, rinsing the substrate with distilled water, and immersing the substrate in a Au electroless plating solution for depositing a Au layer on top of the Co—W—P film alloy.

In the method for forming a Co—W—P—Au film on a substrate, the first and second immersing steps are carried out at ambient temperature. The method may further include the step of mixing a first plating solution of cobalt ions/tungstate ions at a ratio of between about 1 and about 10, stabilizing the plating solution with citrate ions at a citrate ions/cobalt ions ratio of not less than 3, adjusting the pH of the plating solution in the range between 7 and 9 by using a NaOH and boric acid buffer and adding a hypophosphite reducing agent. The method may further include the step of maintaining the first plating solution at a temperature between about 65° C. and about 85° C. The method may further include the step of mixing the first plating solution of cobalt ions/tungstate ions preferably at a ratio of between about 2 and about 4. The method may further include the step of stabilizing the first plating solution with citrate ions at a citrate ions/cobalt ions ratio preferably not less than 5. The method may further include the step of maintaining the first plating solution at a temperature preferably between about 70° C. and about 80° C.

In the method for forming a Co—W—P—Au film on a substrate, the process for forming by adding boric acid at a concentration of at least three times that of the cobalt ions, and adding a surface active agent. The method for forming the first plating solution may further include the step of adding a reducing agent containing hypophosphite at a concentration of at least 1.2 times that of the cobalt ions. The method may further include the step of immersing the substrate in a solution containing preferably at least 30 gr/l of sodium citrate or ethylenediamine tetra acetic acid, sodium salt (EDTA) for removing excess palladium ions.

In the step of electroless plating a Co—W—P film on the substrate, the Co—W—P film produced has a thickness between about 100 Å and about 1500 Å. The electroless plating process can be carried out at a depostion rate of not less than 0.5 μm/hr, and preferably at not less than 0.8 μm/hr.

In the method for forming a Co—W—P—Au film on a substrate, wherein the electroless Au plating step is carried out in a plating solution which has a pH between about 7.0 and about 8.5. The Au plating step may be carried out in a cyanide-free, low pH plating solution. The electroless Au plating step may be carried out in a plating solution which contains a Au salt, a sulfite-thiosulfate electrolyte and a reducing agent. The method may further include the step of depositing a Au layer on top of the Co—W—P film to a thickness of between about 200 Å and about 2,000 Å. The Co—W—P film formed may include between about 85% and about 95% cobalt, between about 1% and about 5% tungsten and between about 5% and about 9% phosphorous. The step of plating the Co—W—P film produces a film preferably having a thickness of between about 200 Å and about 600 Å. The method may further include the step of annealing the Co—W—P film at a temperature of between about 200° C. and about 350° C. in an inert atmosphere such as a forming gas. Annealing step may also be carried out under similar conditions after deposition of the Au film.

The present invention is further directed to an alloy film which includes a Co—W—P film layer, and a Au layer on top of the Co—W—P film layer with Au atoms diffused into the Co—W—P film layer forming a Co—W—P—Au composite film. The Co—W—P film layer may consist of between about 85% and about 95% Co, between about 1% and about 5% W, and between about 5% and about 9% P. The Au layer may have a thickness between about 200 Å and about 2,000 Å.

The present invention is still further directed to a Co—W—P—Au film which includes between about 90% and about 95% Co, between about 1% and about 3% W, between about 3% and about 5% P, and between about 1% and about 2% Au. Sample compositions are 90% Co, 3% W, 5% P and 2% Au; or 95% Co, 1% W, 3% P and 1% Au.

The present invention is further directed to an electronic structure which includes a semi-conducting substrate, a dielectric layer deposited on top of the substrate, a via opening in the dielectric material layer exposing the substrate, a conformal coating layer of Co—W—P alloy in the via opening, and a copper interconnect in the via opening, whereby the conformal coating layer of Co—W—P alloy on copper is a diffusion barrier for preventing copper from diffusing into the semi-conducting substrate and the dielectric material layer.

In the electronic structure, the semi-conducting substrate may be a silicon substrate, the dielectric layer may be a $SiO_2$ layer. The structure may further include a Au layer on top of the Co—W—P conformal coating layer.

The present invention is still further directed to an electronic structure which includes an insulating material layer that has a top surface, at least one copper bond pad formed in a top surface of the insulating material layer, and a layer of Co—W—P—Au composite film overlying the at least one copper bond pad.

In the electronic structure, the Co—W—P—Au film layer may be formed by a Au layer deposited on top of a Co—W—P alloy layer. The structure may further include at least one solder ball on top of the at least one copper bond pad with the Co—W—P—Au composite layer thereinbetween. The electronic structure may further include a ball-limiting-metallurgy (BLM) layer on top of the Co—W—P—Au layer, and at least one solder ball planted on top of the BLM layer, the Co—W—P—Au layer and the at least one copper bond pad.

BRIEF DESCRIPTION OF THE DRAWINGS

These and other objects, features and advantages of the present invention will become apparent upon consideration of the specification and the appended drawings, in which.

DETAILED DESCRIPTION OF THE PREFERRED EMBODIMENT

Figure 1:
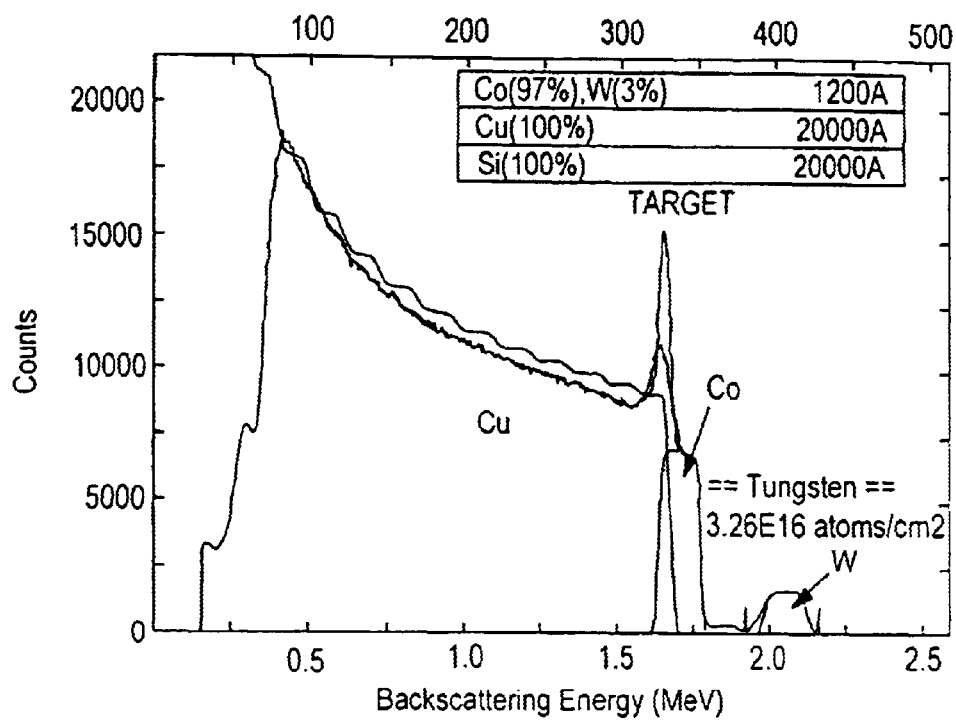
FIG. 1 is a RBS (Rutherford Backscattoning Spectroscopy) spectrum obtained on a present invention Co—W—P film layer before Au deposition.

The present invention discloses a method for forming a quaternary composite film of Co—W—P—Au for use as a diffusion barrier layer on a copper interconnect. The quaternary alloy layer can be effectively used between a copper interconnect and a silicon substrate or an oxide containing dielectric material.

The present novel invention method for forming a quaternary Co—W—P—Au composite film can be carried out by first pretreating a substrate that has built-in copper conductive regions in two separate treatment steps. In the first pre-treatment step, the substrate is immersed in a solution that contains (a) 0.2 M $H_2SO_4$ to remove oxide from Cu surface, followed by $H_2O$ rinse; (b) palladium ions for a length of time that is sufficient for the ions to deposit on the surfaces of the copper conductive regions, followed by $H_2O$ rinse. In a next pre-treatment step, the substrate is immersed in a solution that contains at least 15 gr/l sodium citrate or EDTA for removing excess palladium ions from the surface of the copper conductive regions. The pre-treated substrate is then rinsed with distilled water in a third rinsing step. The rinsed substrate is then electroless plated with a Co—W—P film on the surfaces of the copper conductive regions in a first plating solution that contains cobalt ions, tungstate ions, citrate ions and a reducing agent. The substrate plated with a Co—W—P film is then rinsed by distilled water again in a rinsing step before it is immersed in a second electroless plating solution for depositing a Au layer on top of the Co—W—P film for forming the quaternary composite film.

The first plating solution for the Co—W—P film may be formed by mixing cobalt ions and tungstate ions together at a ratio of between about 1 and about 10, and preferably between about 2 and about 4 in a first step. The plating solution is then stabilized with citrate ions at a citrate ions/cobalt ions ratio of not less than 3, and preferably at not less than 5. The plating solution is then modified by addition of NaOH until a pH value of the plating solution stays in the range of between about 7 and about 9, and preferably between about 7.5 and about 8.5. The first plating solution can be used at a temperature between about 70° C. and about 80° C. The first plating solution is optionally stabilized by boric acid at a concentration of at least three times that of the cobalt ions and then modified by a surface active agent. Next a reducing agent containing hypophosphite is added to carry out the deposition.

In the first electroplating step of the Co—W—P film, a film thickness of between about 100 Å and about 1500 Å is deposited depending on the time of deposition. The film is deposited at a deposition rate of not less than 0.5 $\mu$m/hr, and preferably at a deposition rate of not less than 0.8 $\mu$m/hr.

The electroless Au plating step may be carried out in a plating solution that contains a Au salt, a sulfite-thiosulfate electrolyte and a reducing agent. The Au layer deposited on top of the Co—W—P film has a thickness of between about 200 Å and about 2,000 Å, depending on the most desired applications.

The present invention discloses a novel, effective diffusion barrier layer for protecting copper circuit interconnects and to ensure the reliability of copper chips. The invention further provides a novel method for a stable electroless process that can be used to form a thin layer of a quaternary composite film having the structure of Co—W—P—Au that is deposited on copper lines and pads. Previous to this novel invention novel method, an electroless solution for Au deposition (i.e., high pH cyanide electroless Au solution) could not be used to plate directly Au metal onto base materials such as nickel or cobalt. This old process needed first the deposition of a Au layer using an immersion Au bath prior to plating. The present novel invention method utilizes a dual-step deposition technique by first forming a thin layer of Co—W—P on a copper surface such that the Co—W—P layer becomes auto catalytic and promotes the rapid deposition onto itself of a Au layer when the substrate of copper with the Co—W—P film layer deposited on top is immersed in a sulfite-based immersion gold, cyanide-free plating solution.

To enable the present novel invention method, a unique plating solution for forming the Co—W—P film must first be prepared. The plating solution, or the first plating solution for electroless plating a Co—W—P film layer, can be prepared by the following processing steps:

(a) mixing an electroless plating solution with a ratio of cobalt ions/tungstate ions between about 1 and about 10 (mol/liters), and preferably between about 2 and about 4.

(b) stabilize the ion mixture obtained with citrate ions or any other suitable complexing agents containing poly-carboxylic functionality such as citric acid, succinic acid and the like, as complexing agent. The ratio of citrate ions/cobalt ions should be 3 or larger, and preferably should be 5 or larger.

(c) stabilize the solution pH by adding boric acid at a concentration of at least three times that of cobalt ions.

(d) add a surface active agent, such as a fluorinated compound of FC-98 or any other suitable fluorinated compounds.

(e) adding a reducing agent, such as hypophosphite or any other suitable reducing agents at a concentration of the reducing agent that is 1.2 times the concentration of the cobalt ions.

(f) maintaining the first plating solution at a neutral pH of between about 7 and about 9 and at a temperature between about 65° C. and about 85° C., and preferably between about 73° C. and about 77° C.

The first plating solution is thus prepared for electroless plating of a Co—W—P film on top of a copper substrate, or a substrate that has copper conductive regions exposed. Prior to the first electroless plating process, the copper substrate is first activated by immersing in a palladium ion containing solution such that fine atomic particles of elemental palladium are deposited on the copper surface. The substrate (or a wafer) which contains the activated copper surface is then immersed in a solution of 30 gr/l sodium citrate or EDTA to remove the excess palladium ions from the copper surface. Both of these two pre-treatment steps are carried out on the copper substrate at ambient temperature.

After the pre-treatment steps are performed on the copper surface, the surface is rinsed in a first rinsing step by distilled water. The substrate is then electroless plated with the Co—W—P film by immersing in the first plating solution prepared as described above. The first plating step for the Co—W—P film is normally carried out at a temperature of between about 70° C. and about 75° C. The thickness of the Co—W—P film deposited on the copper substrate depends on several parameters, namely, agitation rate, pH (preferably between about 8.0 and about 8.5), temperature (between about 70° C. and about 75° C.) and time of the electroless deposition. Under the deposition conditions described above, the rate of deposition achieved is approximately 0.8 $\mu$m/hr.

The copper substrate that has a Co—W—P film deposited on top is then rinsed in a second rinsing step by distilled water. The Co—W—P coated copper substrate is then immersed in a cyanide-free, low pH solution of electroless gold which has a pH of between about 7.5 and 8.0. The second plating step, or the gold plating step, utilizes an electroless solution which consists of a gold salt, a sulfite-thiosulphite electrolyte and a reducing agent such as formaldehyde, hypophosphite, ascorbic acid or any other similar reducing agents. The thickness of the gold layer deposited on the Co—W—P layer is normally between about 200 Å and about 2,000 Å thick. It has further been determined that the Co—W—P layer, prior to the gold deposition process, has a composition of between about 85% and about 95% cobalt, between about 1% and about 5% tungstate, and between about 3% and about 10% phosphorous. The composition is determined by a RBS spectrum as shown in FIG. 1.

Figure 2:
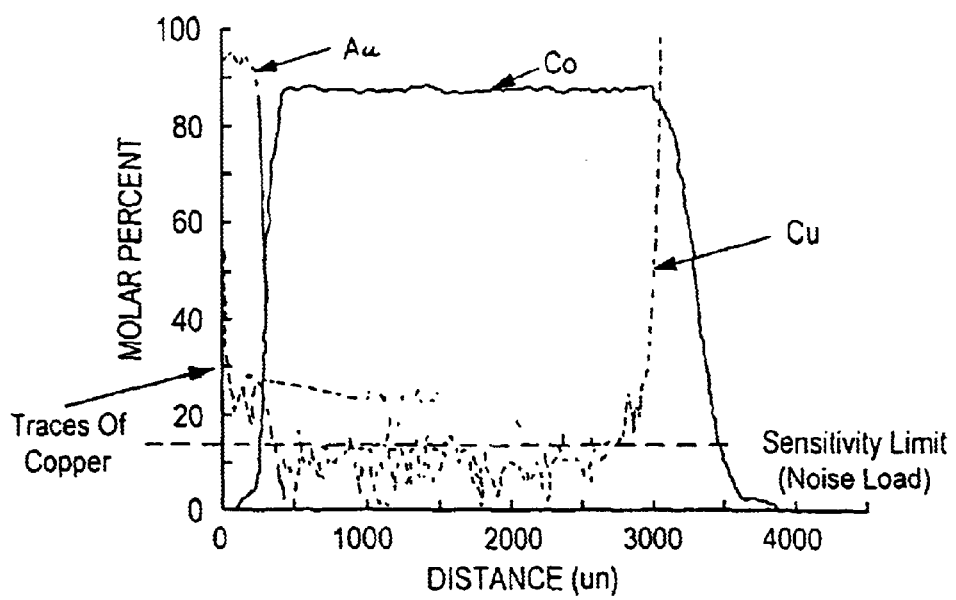
FIG. 2 shows an AES depth profile of a Co—P film with a gold top gettering layer (comparison between Co—P and CoWP).
Figure 3:
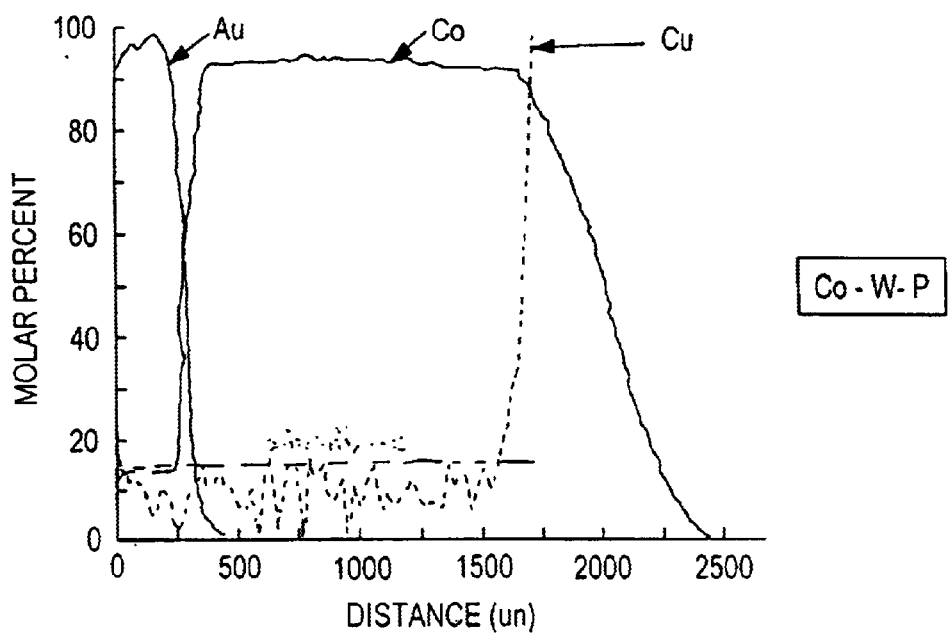
FIG. 3 shows an AES depth profile of a present invention Co—W—P film without a gold top gettering layer.

The thickness of the Co—W—P film layer deposited before the gold plating process is in the range between about 200 Å and about 1500 Å, and can be as small as 100 Å thick. A suitable thickness is between about 200 Å and about 600 Å. It has been found that copper interconnects plated at such thickness revealed excellent coverage of the copper metallurgy and absence of pin holes. Samples of the Co—W—P films, with and without an Au layer as a diffusion sink, are depth profiled by the AES technique. Data are shown in FIGS. 2 and 3, before and after annealing at 400° C. in a forming gas. In each case, the cobalt film was deposited onto a substrate that consists of Si/200 ÅCr/1 μm Cu.

Figure 4:
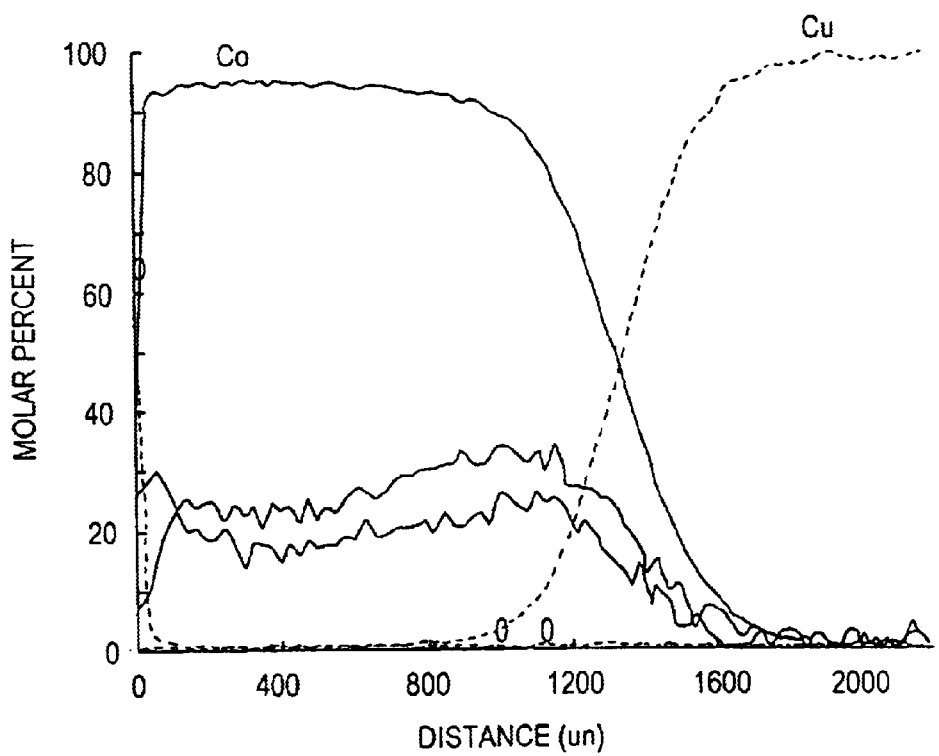
FIG. 4 shows an AES depth profile of a present invention Co—W—P film layer after annealing for 1 hour at 400° C.

As shown in FIGS. 2 and 3, some trace copper was discovered in the Au layer above the detectable limit in simple Co—P films without W present. For instance, traces of copper can be detected in the Co—P—Au film after annealing at 400° C., copper is found in the gold sink layer at levels above the detection limit. However, in the case of the Co—W—P alloy containing 3% atomic W, presence of copper could not be found beyond the noise level. By comparison between FIG. 2 (simply Co—P) and FIG. 3 (Co—W—P), it is evident that Co—P is a much less effective diffusion layer than Co—W—P. This is also shown in FIG. 4. This result shows that the Co—W—P alloy film is an effective diffusion barrier for copper. The Co—W—P film was further observed as very uniform and without pin holes.

The Co—W—P film composition was determined by a RBS analysis which indicates that the film contains about 3.2 atomic percent W. This is shown in FIG. 1. The amount of phosphorous in the film is known from other analysis to be in the order of 7 atomic percent.

Figure 5:
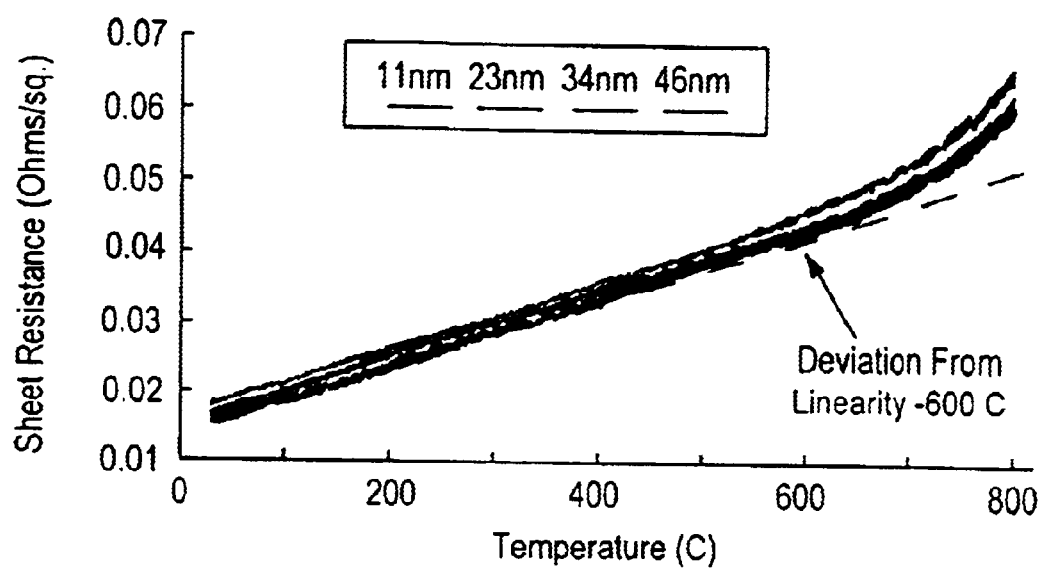
FIG. 5 is a graph illustrating the dependence of sheet resistance on temperature for a present invention Co—W—P film deposited on Cu.

The dependence of in-situ resistance on temperature in Cu—Co—W—P film on copper was further determined and data obtained are shown in FIG. 5. A number of CoWP films ranging from 110 Å to 460 Å of Co—W—P were deposited on Cu—Ta/TaN/Si samples. The films were ramp annealed from 30° C. to 800° C. in nitrogen. While sheet resistance of the films was monitored at various temperatures. All 4 samples which have 110 Å, 230 Å, 340 Å and 460 Å thick Co—W—P films respectively, showed the same behavior. At approximately 600° C., the heating curve of the resistance vs temperature trace deviates from linearity indicating some interdiffusion of the Co—W—P film into the plated copper. At temperatures below 600° C., the slope of the curves indicates a typical linear TCR region. Although the analysis is not sensitive to the very beginning of the interdiffusion, it indicates that the temperature of interdiffusion is about 200° C. higher than the maximum copper processing temperature of about 400° C.

The present novel invention method can be illustrated in the following implementation examples. First, the novel diffusion barrier film of a conformal coating of Co—W—P can be formed in deep internal sub-micron copper interconnect structures to prevent the diffusion of copper into silicon or SiO$_2$ dielectric. The present invention novel diffusion barrier film can further be used for capping of copper pads with a sub-micron layer of Co—W—P—Au to form a reliable wire bound structure on copper chips. Furthermore, the present invention novel diffusion barrier film can further be used for capping of copper pads with a sub-micron layer of Co—W—P—Au to form a reliable wire bond structure on copper chips. Furthermore, the present invention novel diffusion barrier layer can be used as part of a new ball-limiting-metallurgy layer for C-4 technology in copper chips. Either an electroplated C-4 or an injection molded solder generated C-4 requires a new ball-limiting-metallurgy layer to separate eutectic solder ball from copper base. The present invention novel diffusion barrier layer therefore can be used to build a new structure over a copper pad by utilizing the above described Cu—Co—W—P—Au process. Similarly, the present invention novel diffusion barrier layer can be used in a micro-BGA (ball grid array) process.

The present novel invention method for preparing a quaternary alloy film of Co—P—W—Au as a diffusion barrier layer for copper interconnects in a semiconductor structure and devices formed by such structure have therefore been amply described in the above descriptions and in the appended drawings of FIGS. 1–5. The present novel invention diffusion barrier film can be made by the novel process based on the following unique processing features. First, a thoroughly miscible, intimate mixture of cobalt ions and tungstate ions is strongly stabilized by a chelating or complexing agent. The ratio of the cobalt ions/tungstate ions in moles per liter determines their quantitative proportion in the resulting alloy film and controls the diffusion barrier properties of the resulting film. Secondly, an improved buffer system is added to the solution to maintain constant pH at the surface of the film and to counteract the changes in OH concentration due to the electroless deposition process. Thirdly, a suitable reducing agent (preferably hypophosphite) is added to start the electroless plating operation and to maintain a suitable and constant plating rate. Fourthly, a surface active agent is incorporated, preferably a fluorinated compound such as FC-98, to facilitate the removal of H$_2$ from the film surface during the plating process.

While the present invention has been described in an illustrative manner, it should be understood that the terminology used is intended to be in a nature of words of description rather than of limitation.

Furthermore, while the present invention has been described in terms of a preferred and several alternate embodiments thereof, it is to be appreciated that those skilled in the art will readily apply these teachings to other possible variations of the invention.

The embodiment of the invention in which an exclusive property or privilege is claimed are defined as follows:

1. An alloy film comprising:
   a Co—W—P film layer, and
   a Au layer on top of said Co—W—P film layer with Au atoms diffused into said Co—W—P film layer forming a Co—W—P—Au alloy film, said Au layer having a thickness between about 200 Å and about 2000 Å.

2. An alloy film according to claim 1, wherein said Co—W—P film layer consists of between about 85% and about 95% Co, between about 1% and about 5% W, and between about 5% and about 9% P.

3. A Co—W—P—Au film comprising between about 90% and about 95% Co, between about 1% and about 3% W, between about 3% and about 5% P and between about 1% and about 2% Au.

4. An electronic structure comprising:
   an insulating material layer having a top surface,
   at least one copper bond pad formed on said top surface of said insulating material layer,
   a layer of Co—W—P—Au alloy overlying said at least one copper bond pad, and
   at least one solder ball on top of said at least one copper bond pad with said Co—W—P—Au film layer therebetween.

5. An electronic structure comprising:
   an insulating material layer having a top surface,
   at least one copper bond pad formed in said top surface of said insulating material layer,
   a layer of Co—W—P—Au alloy overlying said at least one copper bond pad,
   a ball-limiting metallurgy (BLM) layer on top of said Co—W—P—Au layer, and
   at least one solder ball planted on top of said BLM layer, said Co—W—P—Au layer and said at least one copper bond pad.

* * * * *